United States Patent [19]
Hirota

[11] Patent Number: 6,101,122
[45] Date of Patent: Aug. 8, 2000

[54] DATA LATCH CIRCUIT

[75] Inventor: Takuya Hirota, Tokyo, Japan

[73] Assignee: NEC Corporation, Tokyo, Japan

[21] Appl. No.: 09/273,488

[22] Filed: Mar. 22, 1999

[30] Foreign Application Priority Data

Mar. 27, 1998 [JP] Japan .................................. 10-081491

[51] Int. Cl.⁷ .................................................. G11C 7/00
[52] U.S. Cl. ................................ 365/185.05; 365/230.06; 365/230.08
[58] Field of Search ....................... 365/189.05, 230.06, 365/230.08; 327/52, 57

[56] References Cited

U.S. PATENT DOCUMENTS

| | | | |
|---|---|---|---|
| 5,239,506 | 8/1993 | DaChtera et al. | 365/185.05 |
| 5,708,608 | 1/1998 | Park et al. | 365/185.05 |
| 5,784,329 | 7/1998 | Blankenship et al. | 365/227 |

FOREIGN PATENT DOCUMENTS

| | | |
|---|---|---|
| 1-158692 | 6/1989 | Japan . |
| 4-38793 | 2/1992 | Japan . |
| 5-94693 | 4/1993 | Japan . |
| 7-220474 | 8/1995 | Japan . |

*Primary Examiner*—Vu A. Le
*Attorney, Agent, or Firm*—Young & Thompson

[57] ABSTRACT

A data latch circuit includes a differential amplifier for detecting a potential difference between a pair of signal transmission lines for transmitting a pair of complementary signals, a latch timing signal generator for generating a latch timing signal based on the detection by the differential amplifier, and a latch section for responding to the latch timing signal to latch the complementary signals transferred thereto. A reliable and high-speed signal transmission can be achieved even in a semiconductor device having a large chip size.

6 Claims, 3 Drawing Sheets

DATA LATCH CIRCUIT

BACKGROUND OF THE INVENTION (a) Field of the Invention

The present invention relates to a data latch circuit and, more particularly, to a data latch circuit capable of accurately latching a data signal transferred in a semiconductor device.

(b) Description of the Related Art

With the improvement for finer patterns and high integration in semiconductor device as well as the improvement for a larger capacity therein, some of semiconductor products will have a larger chip area. In order for implementing a larger chip area along with a higher operational-speed in a semiconductor device, improvement for the signal transmission function is especially required for the semiconductor elements without generating an error signal between any locations in the larger chip area of the semiconductor device.

In a semiconductor memory device, for example, a latch circuit is generally used therein as a functional element for effecting accurate take-in or latch of data. The latch circuit is provided in the semiconductor memory device, for example, at the location of an output port or an input port of a digit line for latching the data read out from a memory cell. The latch circuit generally maintains the data latched therein accurately as it is for a specified period.

FIG. 1 shows a schematic configuration of a conventional latch circuit in a semiconductor memory device for latching data delivered from a pair of data transmission lines, such as a pair of complementary digit lines or output lines from a sense amplifier. In this text, the data transmission lines, the digit lines and other data lines having a similar function are collectively referred to as digit lines hereinafter. The latch circuit includes a transfer gate section implemented by a pair of MOSFETs including a pMOSFET 11 and an nMOSFET 12, and a flipflop section implemented by a pair of inverters 16 and 17 wherein each of the outputs of the inverters 16 and 17 is connected to the input of the other of the inverters 16 and 17. The flipflop section may be referred to as a latch section because the latch section functions in fact for take-in of the data, whereas the transfer gate section opens or closes the gate for inputs of the latch section.

The transfer gate section 11 and 12 is disposed between a pair of digit lines 13 and 14 and the flipflop section 16 and 17. The digit lines 13 and 14 receive a pair of complementary signals having opposite phases. The flipflop section functions for latching and holding the data as well as transferring the latched data to another succeeding gate not shown in the figure. MOSFETs 11 and 12 of the transfer gate section are controlled by a latch timing control signal 15 for controlling the latch timing of the latch circuit.

FIG. 2 illustrate a latch timing in the latch circuit of FIG. 1, wherein periods T1 to T3 of a single data transmission cycle are shown in relation to the potential change on the digit lines 13 and 14 whereas periods T4 to T6 are shown in relation to the stage of the transfer gate section. During periods T1 and T3, digit lines 13 and 14 are equalized for the potentials thereof, and during period T2, the data signal constituting complementary signals are transferred to the digit lines from a preceding gate. The transfer gate section is closed during period T4, opened during period T5 and closed again during period T6. The periods T4 to T6 are controlled by the latch timing control signal 15, which is supplied from a CPU which controls the transfer gate section 11 and 12.

The latch circuit of FIG. 1 has a latched state wherein the transfer gate section is closed during the equalizing period T1, a through state wherein the transfer gate section is opened during period T5, which starts before the start of period T2, for latching the data by the latch section, and another latched state wherein the transfer gate section is closed again before the end of period T5 which resides within period T2.

It is important to determine the timing of the data latch by opening the transfer gate section 11 and 12. If the data is latched at the timing at which the amplitudes of data waveforms 22 and 23 shown in FIG. 2 are small, the latch section cannot correctly determine the data, resulting in transmission of an error signal. Particularly, in the case of a high-speed semiconductor device, since the time length of period T2 therein is short, the optimum timing of the data latch is generally difficult to determine.

Especially in the case of a semiconductor device having a large chip area, the difficulty in determining the optimum timing increases further. Referring to FIG. 3 exemplary showing a semiconductor memory device having a large chip size, the memory device includes an array of memory cell areas 31 including specific cell areas 31a and 31b, a plurality of data transmission lines including data transmission lines 32a and 32b corresponding to cell areas 31a and 31b, respectively, and a latch circuit 33 for latching data read out the cell areas 31 through the data transmission lines. The latch circuit 33 receives a latch timing control signal 34 from a control section 35.

In the situation as described above, the difference between the time instants at which data are transmitted from the cell areas 31 and 31b to the latch circuit 33 is caused by the difference in lengths of the data transmission lines 32a and 32b. If the timing for the transfer gate section in the latch circuit 33 is determined by the control section 35 at an optimum timing for the specified cell area 31a, for example, the latch of data supplied from the cell area 31b is performed before an optimum timing for the cell area 31b, thereby raising a possibility of an error signal transmission due to the difference in length of the transmission line.

In short, the difference in the transmission line for the data signal and the control signal together with the higher-speed transmission in the semiconductor device causes an error signal transmission in a semiconductor device.

SUMMARY OF THE INVENTION

In view of the above, it is an object of the present invention to provide a data latch circuit capable of preventing occurrence of an error signal while maintaining a high-speed signal transmission irrespective of the presence of difference in length of the transmission line.

The present invention provides a data latch circuit comprising a data latch circuit comprising a potential detecting section for detecting a potential change on a signal transmission line caused by a transmitted data signal to generate a detection signal, a latch timing signal generator for responding to the detection signal to generate a latch timing signal, and a latch section for responding to the latch timing signal to latch the transmitted data signal from the signal transmission line.

In accordance with the data latch circuit of the present invention, a reliable signal transmission can be achieved wherein data latch can be effected without causing an error signal and without a substantial delay in the signal transmission even in a semiconductor device having a large chip area The above and other objects, features and advantages of the present invention will be more apparent from the following description, referring to the accompanying drawings.

PREFERRED EMBODIMENTS OF THE INVENTION

Figure 1:
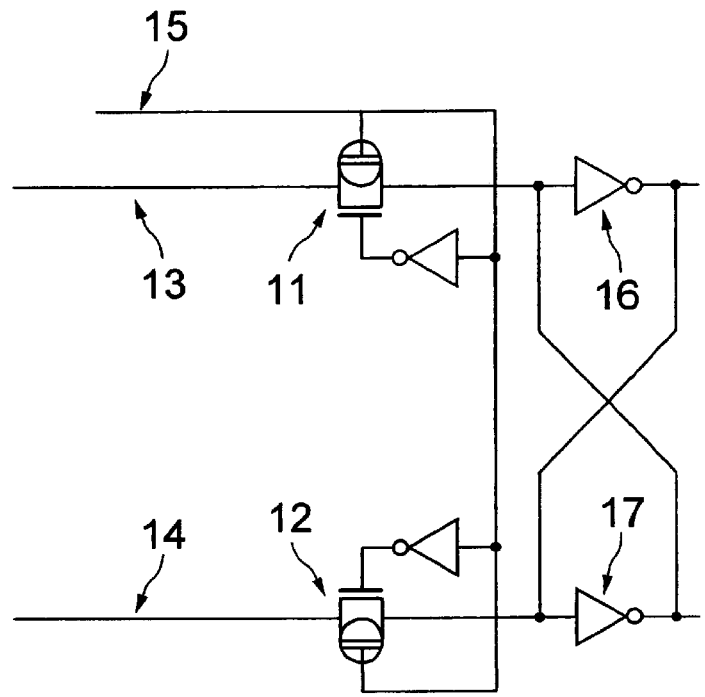
FIG. 1 is a block diagram of a conventional data latch circuit.
Figure 2:
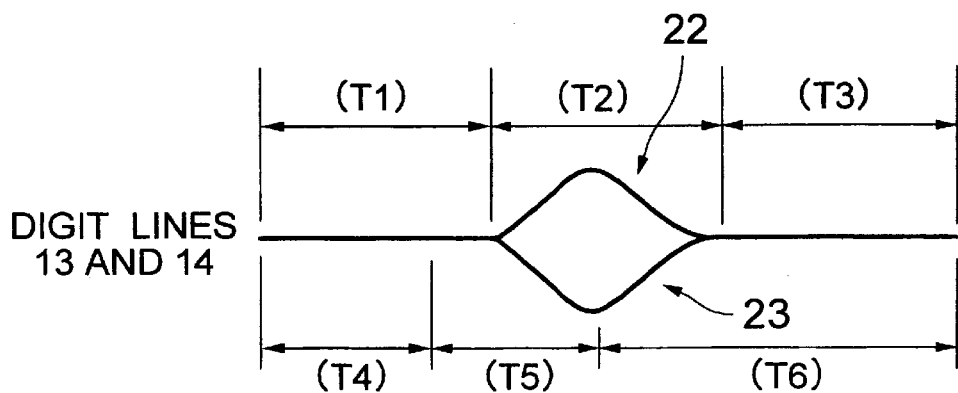
FIG. 2 is a signal timing chart of the latch circuit of FIG. 1.
Figure 3:
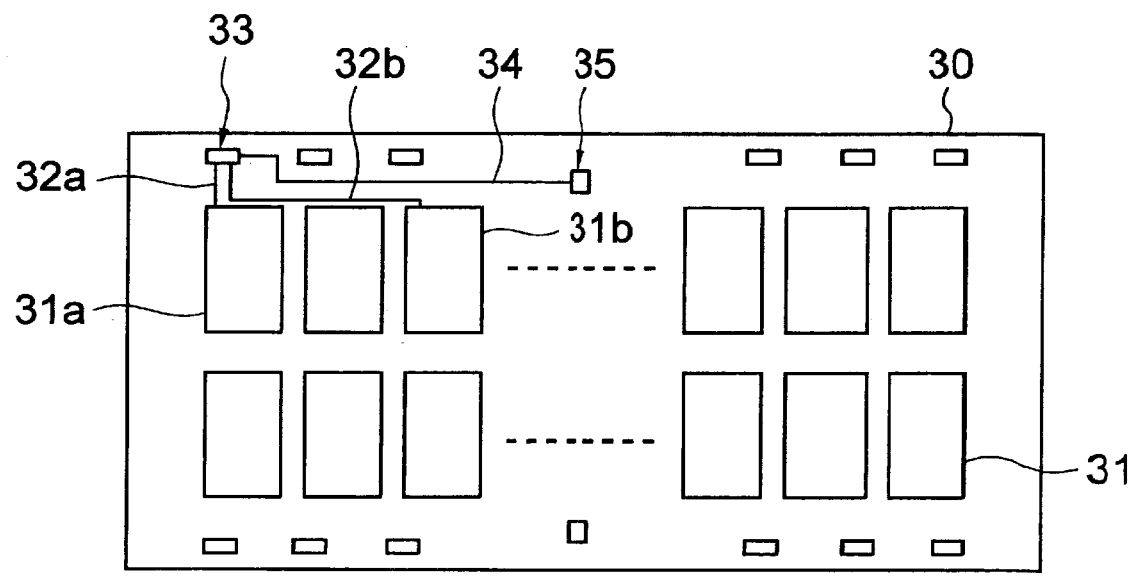
FIG. 3 is a schematic top plan view of a typical semiconductor memory device having a large chip area.

Now, the present invention is more specifically described with reference to accompanying drawings, wherein similar constituent elements are designated by similar reference numerals throughout the drawings.

Figure 4:
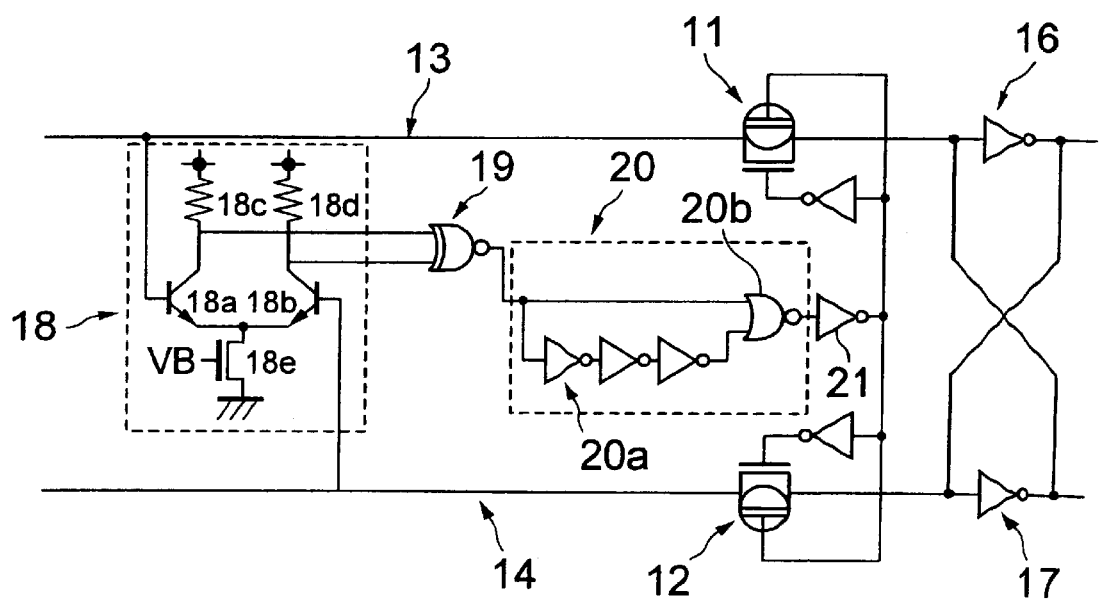
FIG. 4 is a block diagram of a data latch circuit according to an embodiment of the present invention.

Referring to FIG. 4, a data latch circuit according to an embodiment of the present invention includes a differential amplifier 18 for detecting a potential difference between a pair of digit lines 13 and 14 which transmit a pair of complementary signals, an exclusive-NOR (Ex-NOR) gate 19 for converting the output of the differential amplifiers 18 into a digital signal, a latch timing signal generator 20 for generating a latch timing signal based on the output of Ex-NOR gate 19, inverters 21 for transmitting the output of the latch timing signal generator 20 after inversion thereof, a pair of transfer gate transistors 11 and 12 for responding to outputs from the inverters 21 to transfer the data appearing on the digit lines 13 and 14, and a flipflop section including a pair of inverters 16 and 17 for latching the data transferred by the transfer gate transistors 11 and 12.

The differential amplifier 18 is implemented as an emitter coupled logic (ECL) including a pair of bipolar transistors 18a and 18b for receiving the base inputs thereof from a pair of digit lines 13 and 14, a pair of output resistors 18c and 18d each connected between a high-voltage source line and a corresponding one of the collectors of the bipolar transistors 18a and 18b, and a constant current source 18e connected between common emitters of the bipolar transistors 18a and 18b and a low-voltage source line or ground. The constant current source 18e illustrated in FIG. 4 is implemented by an nMOSFET having a gate maintained at a constant voltage VB. Ex-NOR gate 19 receives an output from the differential amplifier 18 to deliver a high-level (H-level) signal when the potential difference between the pair of digit lines 13 and 14 is below the threshold voltage of the differential amplifier 18 and a L-level signal when the potential difference exceeds the threshold voltage.

The latch timing signal generator 20 includes a NOR gate 20b having a pair of inputs connected to a pair of signal lines, which include one for receiving directly an output from Ex-NOR gate 19 and the other for receiving a delayed output from Ex-NOR gate 19 delayed by a plurality of inverters 20a acting as delay gates and disposed along the other of the signal lines. The latch timing signal generator 20 delivers a one-shot pulse which rises to a H-level immediately after the output of Ex-NOR gate 19 changes from H-level to L-level and maintains the H-level thereof for a small period, thereby activating the transfer gate transistors 11 and 12 for signal transmission.

Figure 5:
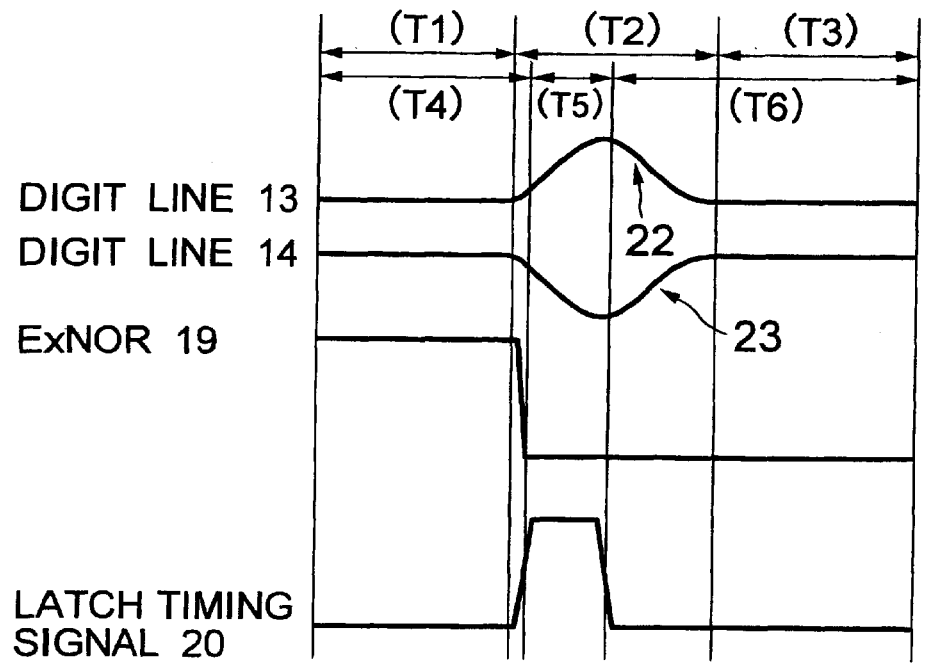
FIG. 5 is a signal timing chart of the data latch circuit of FIG. 4.

Referring to FIG. 5, the digit lines 13 and 14 transmit data signals 22 and 23, respectively, thereon during a signal transmission cycle including periods T1 to T3 (or periods T4 to T6). Period T1 is provided for equalizing the digit lines 13 and 14, wherein the digit lines 13 and 14 are coupled by a coupling transistor not shown in FIG. 4 to exhibit an equal potential. The output of Ex-NOR gate 19 is at a H-level during this period T1. Period T2 is provided for data transmission for transmitting the data signals 22 and 23 on the digit lines 13 and 14, wherein the potential difference between the digit lines 13 and 14 increases from zero. The differential amplifier 18 detects the rise of the potential difference based on the threshold voltage thereof after some period elapsed since the start of period T2, thereby lowering the output of Ex-NOR gate 19 to a L-level. The latch timing signal generator 20 responds to the L-level of Ex-NOR gate 19 to deliver a one-shot pulse during an entire duration of period T5, which is shorter than period T2, thereby activating the transfer gate transistors 11 and 12. The transfer gate transistors 11 and 12 are again inactivated before the end of period T2. Subsequently, the data latch circuit maintains the latched data within the flipflop section during period T6 until the digit lines 13 and 14 transmit a succeeding data signal.

As described above, in the data latch circuit according to the present embodiment, the generation of the latch timing signal is not based a usual timing clock signal for signal transmission but based on the actual rise of the data signal on the digit lines detected by the differential amplifier. Thus, the difference between the lengths of signal transmission paths does not cause an error signal even in a semiconductor device having a large chip size, thereby enabling a reliable signal transmission in the semiconductor device.

The delay time by the delay gates 20a in the latch timing signal generator 20 is determined such that the pulse duration T5 of the one-shot pulse is smaller than period T2 which corresponds to the pulse duration of the complementary signals transmitted on the digit lines, and is sufficient for operation of the transfer gate transistors 11 and 12 and the flipflop section.

In the signal transmission by the data latch circuit of the present embodiment, no substantial delay is caused because no additional logical stage is provided in the data latch circuit between the digit lines and the transfer gate transistors.

Figure 6:
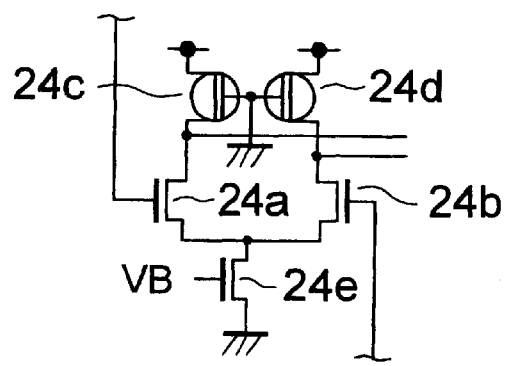
FIG. 6 is a circuit diagram of another example of differential circuits for use in the data latch circuit of FIG. 4.

In the above embodiment, the differential amplifier is implemented by a pair of bipolar transistors. However, the differential amplifier may be implemented by a CMOSFET such as shown in FIG. 6. All the circuit elements in the differential amplifier of FIG. 6 are implemented by MOSFETs, including a pair of differential transistors 24a and 24b, output resistors 24c and 24d, and a constant current source 24e. The bipolar transistors in the differential amplifier in the above embodiment achieves a higher-speed operation, whereas the MOSFETs in the differential amplifier of FIG. 6 achieves a lower power dissipation.

The pair of digit lines in the above embodiment may be replaced by a single signal transmission line. In this case the differential amplifier may have a first input for receiving the data signal from the single signal transmission line and a second input connected to a reference voltage line.

Since the above embodiments are described only for examples, the present invention is not limited to the above embodiments and various modifications or alterations can be easily made therefrom by those skilled in the art without departing from the scope of the present invention.

What is claimed is:

1. A data latch circuit comprising a potential detecting section for detecting a potential change on a signal transmission line caused by a transmitted data signal to generate a detection signal, a latch timing signal generator for responding to the detection signal to generate a latch timing signal, and a latch section for responding to the latch timing signal to latch the transmitted data signal from the signal transmission line.

2. The data latch signal as defined in claim 1, wherein the data signal is implemented by a pair of complementary signals, and said potential detection section is implemented by a differential amplifier for detecting a potential difference between the complementary signals.

3. The data latch circuit as defined in claim 2, wherein said differential amplifier comprises a plurality of bipolar transistors.

4. The data latch circuit as defined in claim 2, wherein said differential amplifier comprises a plurality of MOSFETs.

5. The data latch circuit as defined in claim 1, wherein he data signal is transmitted by a single signal transmission line, and said potential detecting section is implemented by a differential amplifier having a first input connected to said single signal transmission line and a second input connected to a reference voltage line.

6. The data latch circuit as defined in claim 1, wherein said latch section comprises a transfer gate for responding to the latch timing signal to transfer the data signal, and a flipflop for latching the data signal transferred by said transfer gate.

* * * * *